United States Patent [19]

Takahashi

[11] Patent Number: 5,610,925
[45] Date of Patent: Mar. 11, 1997

[54] FAILURE ANALYZER FOR SEMICONDUCTOR TESTER

[75] Inventor: Koji Takahashi, Tokyo, Japan

[73] Assignee: Advantest Corporation, Tokyo, Japan

[21] Appl. No.: 410,818

[22] Filed: Mar. 27, 1995

[51] Int. Cl.$^6$ ............................ G01R 31/28; G06F 11/00
[52] U.S. Cl. ...................... 371/22.1; 371/21.1; 371/21.6; 371/5.1; 324/73.1
[58] Field of Search ............................ 371/21, 10, 10.3, 371/25.1, 16.5, 29.1, 22.1, 21.6, 5.1, 40.2; 324/73 R; 395/575; 364/900

[56] References Cited

U.S. PATENT DOCUMENTS

| | | | |
|---|---|---|---|
| 3,962,687 | 6/1976 | Suzumura et al. | 340/173 R |
| 4,369,511 | 1/1983 | Kimura et al. | 371/21 |
| 4,460,999 | 7/1984 | Schmidt | 371/21 |
| 4,550,387 | 10/1985 | Takita | 364/900 |
| 5,216,673 | 6/1993 | Kanai | 371/21.2 |
| 5,410,687 | 4/1995 | Fujisaki et al. | 395/575 |

*Primary Examiner*—Robert W. Beausoliel, Jr.
*Assistant Examiner*—Nadeem Iqbal
*Attorney, Agent, or Firm*—Knobbe, Martens, Olson & Bear

[57] ABSTRACT

A failure analyzer for the semiconductor tester which tests a plurality of devices at the same time and stores a first fail information for each device under test (DUT) and inhibits further fail information from being stored in a fail memory. The failure analyzer includes a plurality of comparators connected to corresponding DUT for generating a fail signal when the output signal from the DUT disagrees with an expected signal, a fail memory connected to the comparators to store fail information on the DUT, a plurality of fail receiving circuits for receiving the fail signals from the comparators wherein each of the fail receiving circuits counts the number of the fail signal from corresponding one of the comparators and generating a counted signal when the fail signal reaches a predetermined number, a plurality of inhibit circuits connected to the fail receiving circuits to inhibit the fail signals received after the predetermined number from affecting the fail memory, an OR-gate for combining output signals from the inhibit circuits to generate an overall fail signal, and a fail memory controller connected to the fail memory to enable the fail memory when receiving the overall fail signal from the OR-gate.

5 Claims, 5 Drawing Sheets

FAILURE ANALYZER FOR SEMICONDUCTOR TESTER

FIELD OF THE INVENTION

The present invention relates to a failure analyzer for a semiconductor tester, and more particularly, to a failure analyzer which can memorize the first failure information of each of a plural devices under simultaneous measurement.

BACKGROUND OF THE INVENTION

Generally, most failure analyzers for a semiconductor tester have only one control part for failure analysis. For this reason, in a plural-device test, it was hard to detect the failure position of all devices at once.

FIG. 4 shows an example of the conventional failure analyzer, generally used in the semiconductor test. This is a block diagram of four-device simultaneous measurement. Referring to FIG. 4, each of the devices under test (DUT), DUT#1.11 to DUT#4.14 outputs three signals: A, B and C. These output signals are provided to the comparator group 20 which compares these output signals with expected data, and, if a match does not occur, outputs a FAIL signal, that is, a failure signal.

An OR-gate 31 ORs the FAIL signals of DUT#1.11, and gives the OR data, a FOR1 signal to an AND gate 41 of a failure-masking section 40. In the same way, failure signals of DUT#2, #3 and #4 are ORed at OR-gates 32, 33 and 34, and then their ORed data are given to AND-gate 42, 43 and respectively. The outputs of AND-gates (41, 42 and 43) are applied to an OR-gate 45 to make a total failure signal STOR for all devices. Next, a data fail memory (DFM) control section 50 controls the total failure signal STOR and gives a store control (STC) signal to a failure memory 60.

By the way, the number of test patterns to compare with a device under test (hereinafter referred to as DUT) is 64 kH to 16 MW or more. Of the other hand, the capacity of failure memory is 1 kW at the most.

Regarding a difference between their capacity, in fact, there is possibility that all test patterns are used for a single-device failure analysis. However, such a small capacity has been suppose to be enough for the failure memory.

Here, the DFM control section 50 shown in FIG. 4 accepts the total failure signal; that is, OR-data of all devices failure signals, from the failure-masking section 40 and controls when to start or stop the failure memory, based on the number of patterns, pattern addresses and total failures. Because of the OR-data, however, the DFM control section 50 cannot identify which device the failure signal comes from.

The conventional failure analyzer can easily get information which only indicates that all the devices have passed or failed. However, to analyze the failure for each device, it had to measure plural times which is equivalent to the number of devices, invalidating unnecessary failure signals by using failure-masking function, which applies a mask signal to AND-gates (41, 42, 43 and 44) of failure-masking section 40. This process can identify a specific failure signal FORn to the DFM control section 50 which controls failure analysis.

Even if masking an arbitrary number of devices, however, the following problem occurs. FIG. 5 shows failure signals for each drive store signals produced by the failure signals. As shown in FIG. 5, since a device, DUT#2 is masked, a store signal STOR will not be generated for DUT#2. A store signal STOR of DUT#1A occurs first and enters to the DFM control section. Then other store signals occur in the order of DUT#4B, DUT#1B . . . . Here, if the failure memory is assumed to store eight data at a maximum, DUT#3's failure result which occurred at the ninth time cannot be stored into the failure memory.

Accordingly the conventional failure analyzer is suitable only for single-device failure analysis. If analyzing the failure of plural devices, it is necessary to apply the same test pattern for one of the plural devices while masking the other devices.

SUMMARY OF THE INVENTION

It is a purpose of this present invention to provide a failure analyzer for a semiconductor tester, so as to improve the above mentioned problem existing in the conventional technique, and more particularly, to provide a failure analyzer which can analyze plural devices with one cycle of test pattern and store their failure data; namely, to provide a failure analyzer which is available for plural-device simultaneous measurement.

According to the present invention, the failure analyzer which is available for a plural-device simultaneous measurement includes failure-counting means to accept and count a failure signal FORn of each device, gate means to interrupt the progress of the failure signal by the output from the failure-counting means and OR-gate means to OR the output of the gate means and to output a total failure signal, a DFM control section to control a failure memory with the total failure signal.

According to this invention, the first failure signal brings a failure output only once. After this, the failure output will not arise since the gate means inhibits other failure signals through flip-flop's output-inverting operation. This function allows one cycle of test pattern to detect the first failure of the plural device. On the other hand, to obtain the same effect, it was previously necessary to repeat the test pattern output plural times which is equivalent to the number of devices.

Further, it is also possible to detect arbitrary number of failures by applying such a failure-counting means as a counter.

DESCRIPTION OF THE PREFERRED EMBODIMENT

Figure 1:
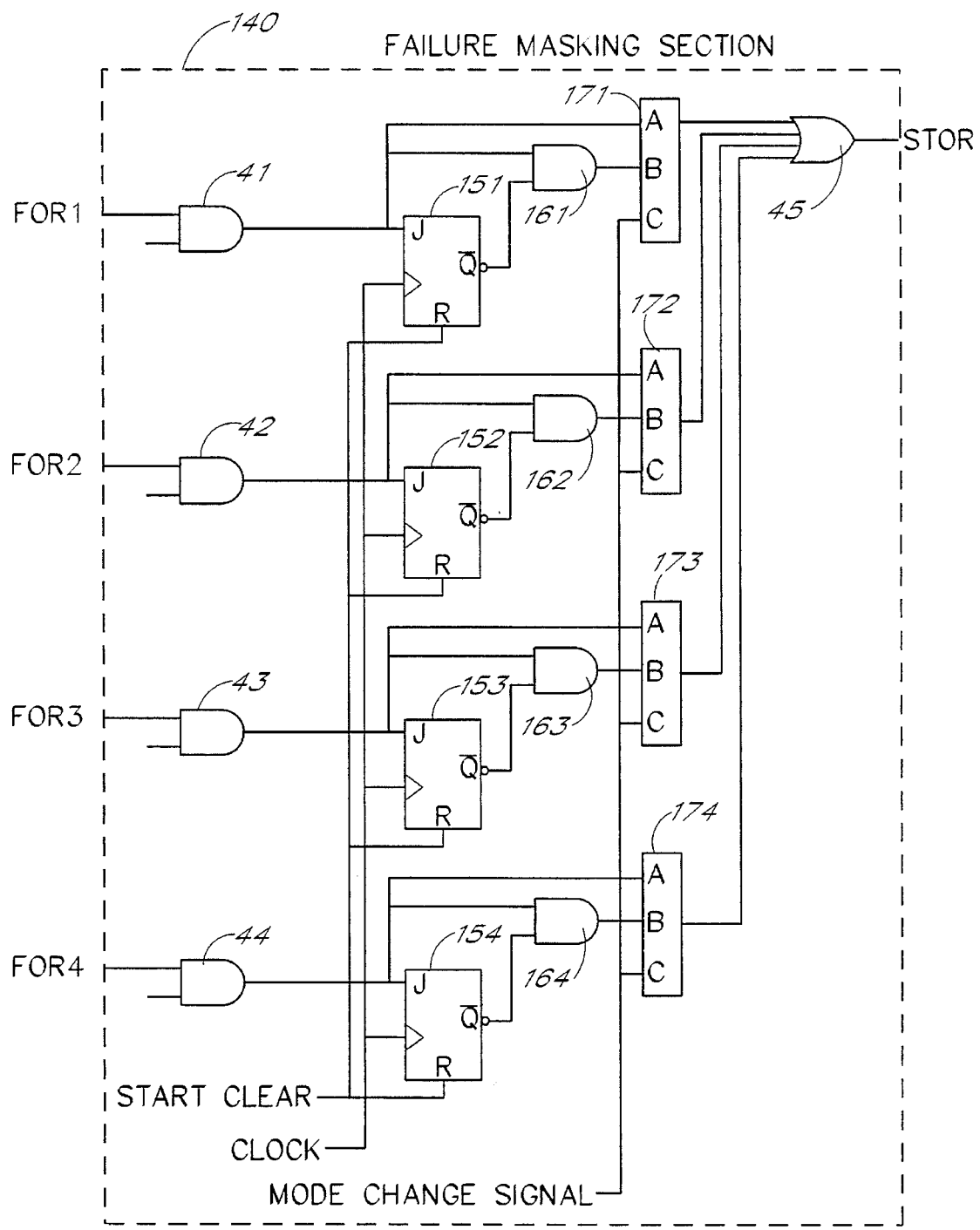
FIG. 1 is a block diagram showing an embodiment of the invention.

Referring to the figures, an embodiment of the present invention will be described. FIG. 1 is a block diagram showing an embodiment of the invention. A failure masking section 140 is configured as follows. The failure signal of DUT#1 enters a flip-flop 151; an inverted output terminal of the flip-flop 151 is connected to an input terminal of an AND-gate 161; another input terminal of the AND-gate 161 is connected to the input terminal of the flip-flop 151; an external clock signal is given to the trigger terminal of the flip-flop 151; the output terminal of the AND-gate 161 is connected to a selector 171 which changes to the conventional operation with a mode change signal; the output terminal of the selector 171 is connected to an input terminal of an OR-gate 45. Similarly, a failure signal FOR2 of DUT#2 enters the circuit stage which includes a flip-flop 152, and AND-gate 162 and a selector 172. DUT#3 and DUT#4 are also supported by the same circuit stage as described above.

Figure 2:
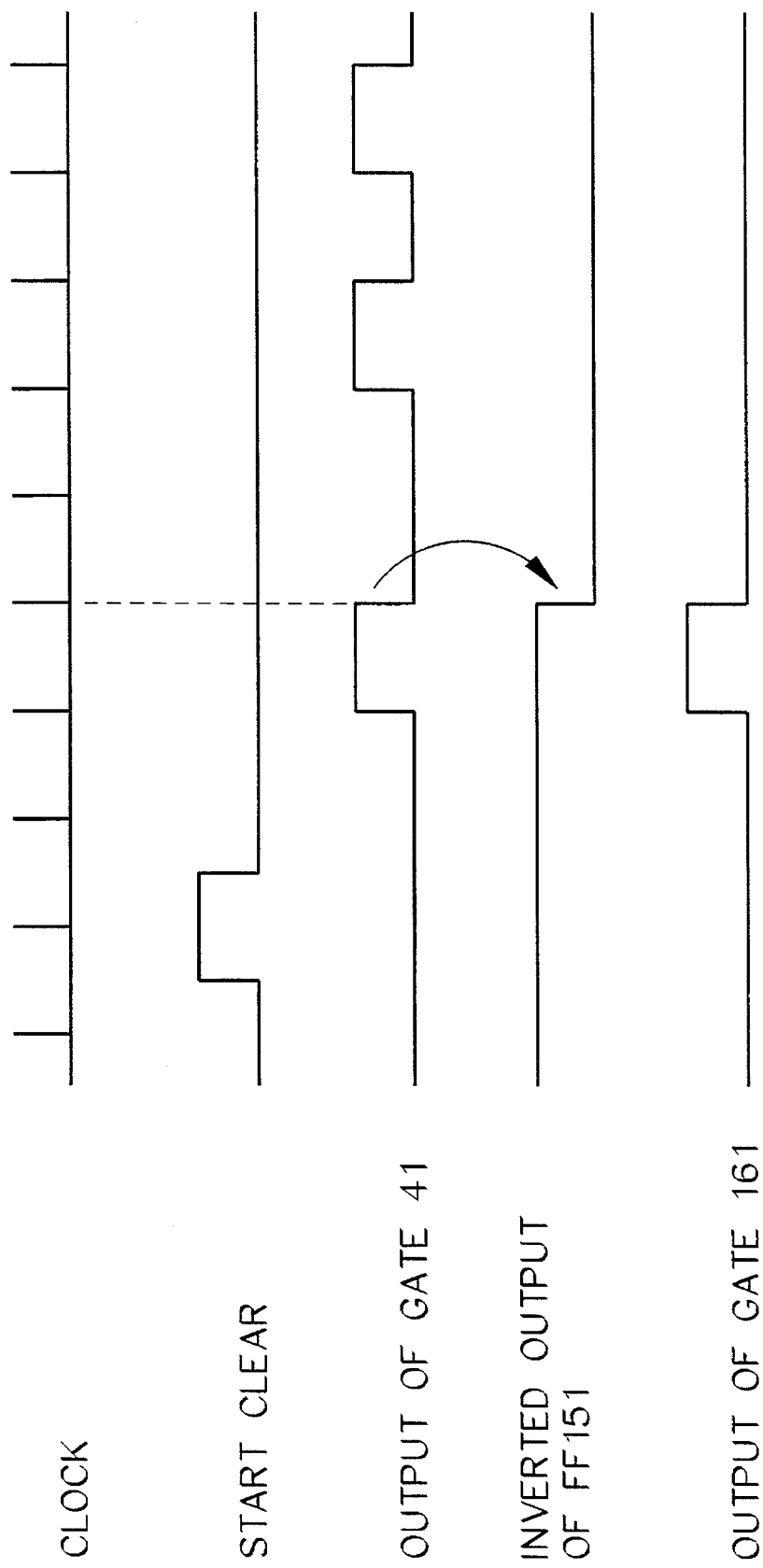
FIG. 2 is a failure output timing chart according to the invention.

FIG. 2 is a failure output timing chart according to the invention. First, a start clear signal clears the flip-flop 151; second, a failure signal comes having a waveform shown as the output of a gate 41. This first fail signal makes the gate 161 output a failure signal. After that, since the flip-flop 151 inverts its output, the gate 161 interrupts the progress of the failure signal and does not make any failure signals pass.

Figure 3:
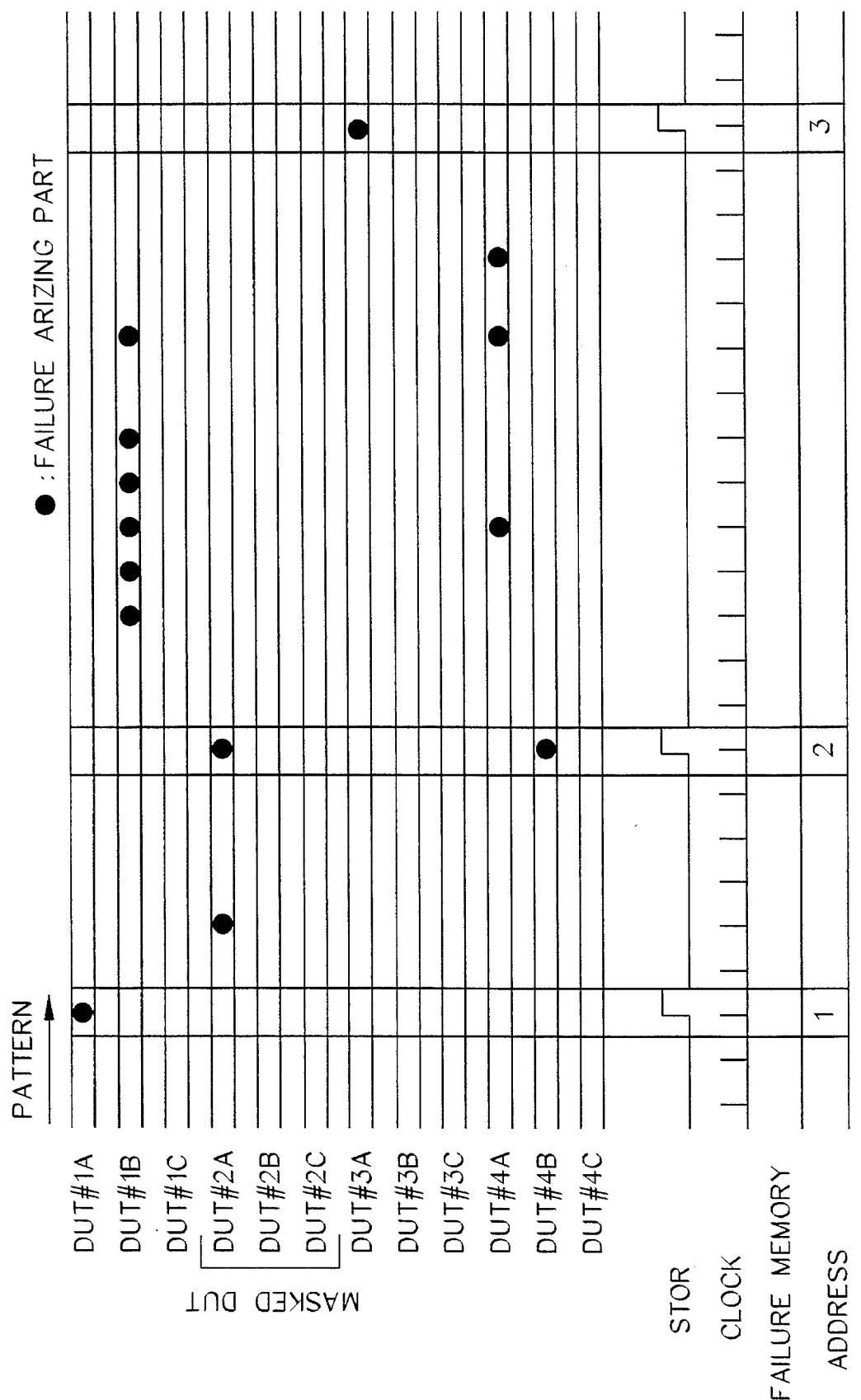
FIG. 3 shows that failure signals of each DUT cause the STORE signal to be output to the failure memory, according to the invention.
Figure 4:
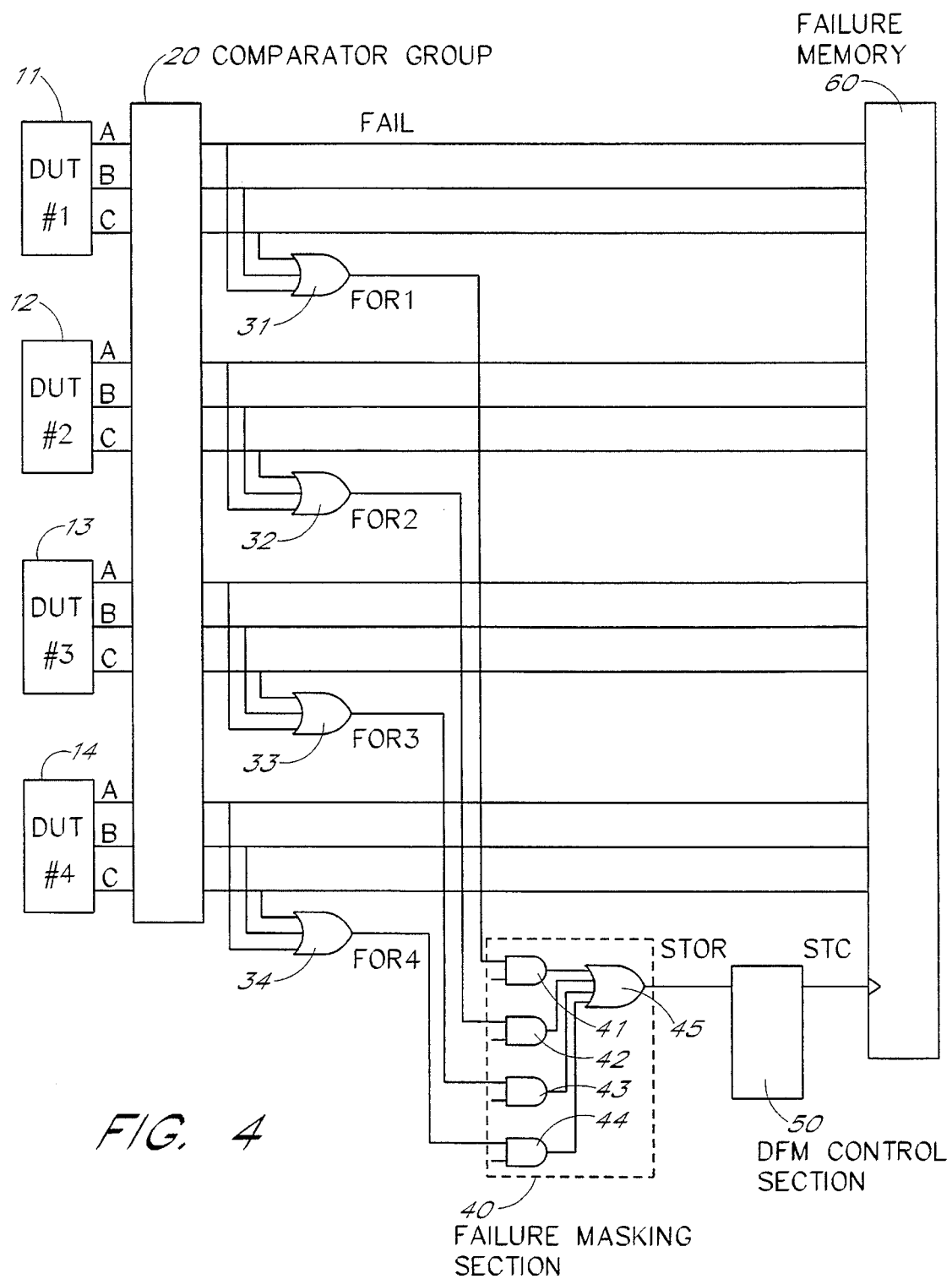
FIG. 4 shows an example of the conventional semiconductor failure analyzer.
Figure 5:
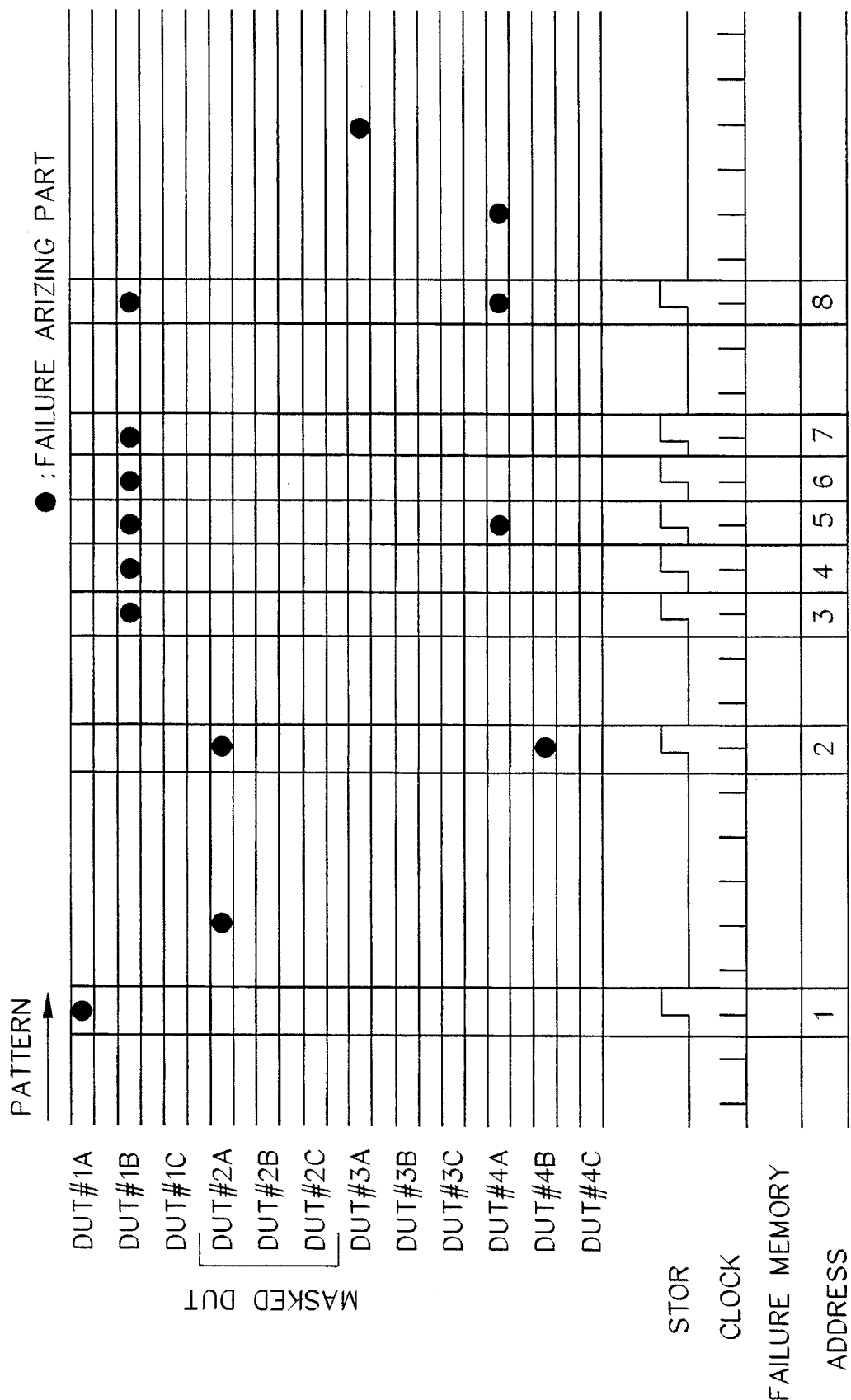
FIG. 5 shows that failure signals of each DUT cause the STORE signal to be output to the failure memory, according to the conventional technique.

FIG. 3 shows that failure signals of each DUT and the store signal STORE provided to the failure memory based on the failure signals according to the invention. In FIG. 3, DUT#2 is masked and will not cause a store signal to generate. Further, the failure memory is assumed to have eight data at a maximum. The store signal STOR corresponding to DUT#1A arises first for the DFM control section 50; second, the store signal corresponding to DUT#4B arise; at the third time, the store signal corresponding to DUT#3A arises. In such a way, only the first failure of DUT#1, DUT#3 and DUT#4 is stored into the failure memory 60. This function allows only a cycle of test pattern to find if DUT is faulty.

In the above configuration, only the first failure of each DUT is stored in the failure memory 60. There are, however, cases where an arbitrary number of failures needs to be stored. For such cases, the failure masking section 140 should be modified like the following:

The flip-flops 151, 152, 153 and 154 are replaced with counters 151, 152, 153 and 154 each of which can be assigned with an arbitrary numeric value. Then, after the counters counting the assigned number, the gate circuits 161, 162, 163 and 164 are closed.

The present invention are comprised of the above description and brings about the following effect; in a plural-device simultaneous measurement, the present invention enables the failure analyzer for the semiconductor tester to memorize the failure information of each DUT with one cycle of test pattern, without failure analyzers which are equivalent to the number of devices to be tested.

What is claimed is:

1. A failure analyzer for a semiconductor tester for simultaneously measuring a plurality of semiconductor devices, comprising:

a plurality of comparators connected to corresponding semiconductor devices to be tested (DUT) to receive output signals from said semiconductor devices, each of said comparators generating a fail signal when the output signal from said DUT disagrees with an expected signal;

a fail memory connected to outputs of said plurality of comparators to store fail information of said DUT;

a plurality of fail receiving circuits for receiving said fail signals from said comparators, each of said fail receiving circuits counting the number of said fail signal from corresponding one of said comparators and generating a counted signal when the number of said fail signal reaches a predetermined value;

a plurality of inhibit circuits connected to said fail receiving circuits to inhibit said fail signals received after said counted signal from affecting said fail memory; and an OR-gate for combining output signals from said plurality of inhibit circuits to generate an overall fail signal; and a fail memory controller connected to said fail memory and said OR-gate to enable said fail memory when receiving said overall fail signal from said OR-gate.

2. A failure analyzer as defined in claim 1, wherein each of said fail receiving circuits is a flip-flop which changes state by receiving a first fail signal from said comparator and initiates corresponding one of said inhibit circuits to inhibit fail signal other than said first fail signal from reaching said OR-gate.

3. A failure analyzer as defined in claim 1, wherein each of said fail receiving circuits is a counter which changes state by receiving a predetermined number of fail signals from said comparator and initiates corresponding one of said inhibit circuits to inhibit fail signals other than said predetermined number from reaching said OR-gate.

4. A failure analyzer as defined in claim 1, wherein each of said inhibit circuits is an AND-gate one input of which is connected to corresponding one of said comparators and the other input of which is provided with said counted signal from said receiving circuit.

5. A failure analyzer as defined in claim 1, wherein said failure analyzer further includes a plurality of selectors to selectively transmit either said fail signals from said comparators or said fail signals received before said counted signal from said inhibit circuits to said OR-gate.

* * * * *